(12) United States Patent
Ann et al.

(10) Patent No.: US 10,750,624 B2
(45) Date of Patent: Aug. 18, 2020

(54) DISPLAY DEVICE AND FRAME MEMBER

(71) Applicant: SAMSUNG ELECTRONICS CO., LTD., Suwon-si, Gyeonggi-do (KR)

(72) Inventors: Sung Jin Ann, Seoul (KR); Ki Hong Kim, Goyang-si (KR); Sang Young Lee, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/468,580

(22) PCT Filed: Aug. 24, 2017

(86) PCT No.: PCT/KR2017/009232
§ 371 (c)(1),
(2) Date: Jun. 11, 2019

(87) PCT Pub. No.: WO2018/110795
PCT Pub. Date: Jun. 21, 2018

(65) Prior Publication Data
US 2020/0084896 A1 Mar. 12, 2020

(30) Foreign Application Priority Data
Dec. 14, 2016 (KR) .................. 10-2016-0170096

(51) Int. Cl.
*H05K 5/00* (2006.01)
*H01F 7/02* (2006.01)

(52) U.S. Cl.
CPC ......... *H05K 5/0017* (2013.01); *H01F 7/0252* (2013.01); *H05K 5/0008* (2013.01)

(58) Field of Classification Search
CPC ... H05K 5/0017; H05K 5/0008; H01F 7/0252
See application file for complete search history.

(56) References Cited

U.S. PATENT DOCUMENTS

| 6,615,526 B2 | 9/2003 | Pitcher et al. |
| 2002/0139026 A1 | 10/2002 | Pitcher et al. |

(Continued)

FOREIGN PATENT DOCUMENTS

| CN | 205103517 | 3/2016 | |
| CN | 205103517 U | * 3/2016 | ....... G02F 1/133308 |

(Continued)

OTHER PUBLICATIONS

Extended European Search Report dated Nov. 18, 2019 in European Patent Application No. 17881309.3.

(Continued)

*Primary Examiner* — Abhishek M Rathod
*Assistant Examiner* — Keith DePew
(74) *Attorney, Agent, or Firm* — Staas & Halsey LLP (57) ABSTRACT

The disclosure discloses a display device and a frame member. A display device according to an aspect of the disclosure includes a bezel that forms a border of a display and a frame fixed to the bezel to hide a front surface of the bezel. The bezel includes at least one first member, the frame includes a plurality of frame pieces, and each of the plurality of frame pieces includes at least one second member and is fixed to the bezel by an attractive force between the first member and the second member.

13 Claims, 12 Drawing Sheets

(56) References Cited

U.S. PATENT DOCUMENTS

| | | | |
|---|---|---|---|
| 2005/0151894 A1* | 7/2005 | Katsuda | G02F 1/133308 349/58 |
| 2008/0218952 A1 | 9/2008 | Benn | |
| 2009/0027583 A1* | 1/2009 | McBroom | G06F 1/1601 349/58 |
| 2011/0089792 A1* | 4/2011 | Casebolt | B29C 45/14311 312/223.2 |
| 2013/0088820 A1* | 4/2013 | Kuroda | H05K 5/0017 361/679.01 |
| 2015/0015793 A1* | 1/2015 | Noguchi | H04N 5/64 348/725 |
| 2015/0282334 A1* | 10/2015 | Yamamoto | G02F 1/133308 362/97.1 |
| 2017/0139258 A1* | 5/2017 | Jiang | G02F 1/133308 |
| 2018/0052354 A1* | 2/2018 | Li | G02F 1/133308 |

FOREIGN PATENT DOCUMENTS

| | | | |
|---|---|---|---|
| DE | 202009015698 U1 * | 3/2010 | H04M 1/0266 |
| DE | 202009015698 | 4/2010 | |
| KR | 10-2010-0085541 | 7/2010 | |
| KR | 10-2011-0115647 | 10/2011 | |
| KR | 10-2013-0081116 | 7/2013 | |
| KR | 10-2004-0063651 A | 7/2014 | |
| KR | 10-2015-0102617 | 9/2015 | |

OTHER PUBLICATIONS

International search report dated Dec. 5, 2017 in corresponding International Patent application No. PCT/KR2017/009232.
Written Opinion of the International Searching Authority dated Dec. 5, 2017 in corresponding international Patent Application No. PCT/KR2017/009232.

* cited by examiner

DISPLAY DEVICE AND FRAME MEMBER

TECHNICAL FIELD

Various embodiments of the disclosure relate to a display device and a frame member for decorating the appearance of a display.

BACKGROUND ART

A stationary display device such as TV is used while fixed to a position in a user's environment (house), and the replacement cycle is long. On the other hand, the user's environment may change frequently due to interior decoration, moving to a new house, and the like. Therefore, when selecting a display device, the user chooses a plain design that the user is not easily tired of and that is not greatly affected by surroundings.

DISCLOSURE

Technical Problem

A display device (e.g., a smartphone) in the related art may provide a separate frame mounted on the periphery of the display device for decoration, shock absorption, or user convenience (e.g., mounting convenience or portability). The frame of the display device in the related art is formed of an elastic material (e.g., silicone) to increase convenience of detachment. However, the frame of the display device in the related art is not well applied to a large display device due to high cost of implementation.

Various embodiments of the disclosure may provide a display device and a frame member for replacing at least part of a frame of the display device.

Technical Solution

A display device according to an aspect of the disclosure includes a bezel that includes at least one first member and forms a border of a display and a frame that is fixed to the bezel to hide a front surface of the bezel and that includes a plurality of frame pieces. Each of the plurality of frame pieces includes at least one second member and is fixed to the bezel by an attractive force between the first member and the second member.

A frame member according to another aspect of the disclosure that is coupled with a bezel that includes at least one first member and forms a border of a display device includes a plurality of frame pieces fixed to the bezel to hide a front surface of the bezel. Each of the plurality of frame pieces includes a housing including a hollow region and at least one second member embedded in the hollow region to exert an attractive force on the first member.

Advantageous Effects

According to embodiments disclosed herein, at least part of a frame of a display device is able to be replaced or changed.

MODE FOR INVENTION

Hereinafter, various embodiments of the disclosure will be described with reference to the accompanying drawings. However, those of ordinary skill in the art will recognize that modification, equivalent, and/or alternative on the various embodiments described herein can be variously made without departing from the scope and spirit of the disclosure. With regard to description of the drawings, similar components may be marked by similar reference numerals.

A display device described herein may provide a picture frame function. For example, the display device may include at least one of TV, a monitor, a notebook computer, a large format display (LFD), a desktop personal computer (PC), a laptop personal computer (PC), or a netbook computer. In another example, the display device may include at least one of a smartphone, a tablet personal computer (PC), a mobile phone, a video phone, an e-book reader, a personal digital assistant (PDA), a portable multimedia player (PMP), an MP3 player, a camera, or a wearable device.

According to an embodiment, the display device may be maintained in a black screen state when there is no user around the display device, and may provide a picture frame function when a user is around the display device. The display device according to the embodiment may provide a main function (e.g., wall-mounted TV) and may provide an interior effect by the appearance thereof when the main function is not used.

Figure 1:
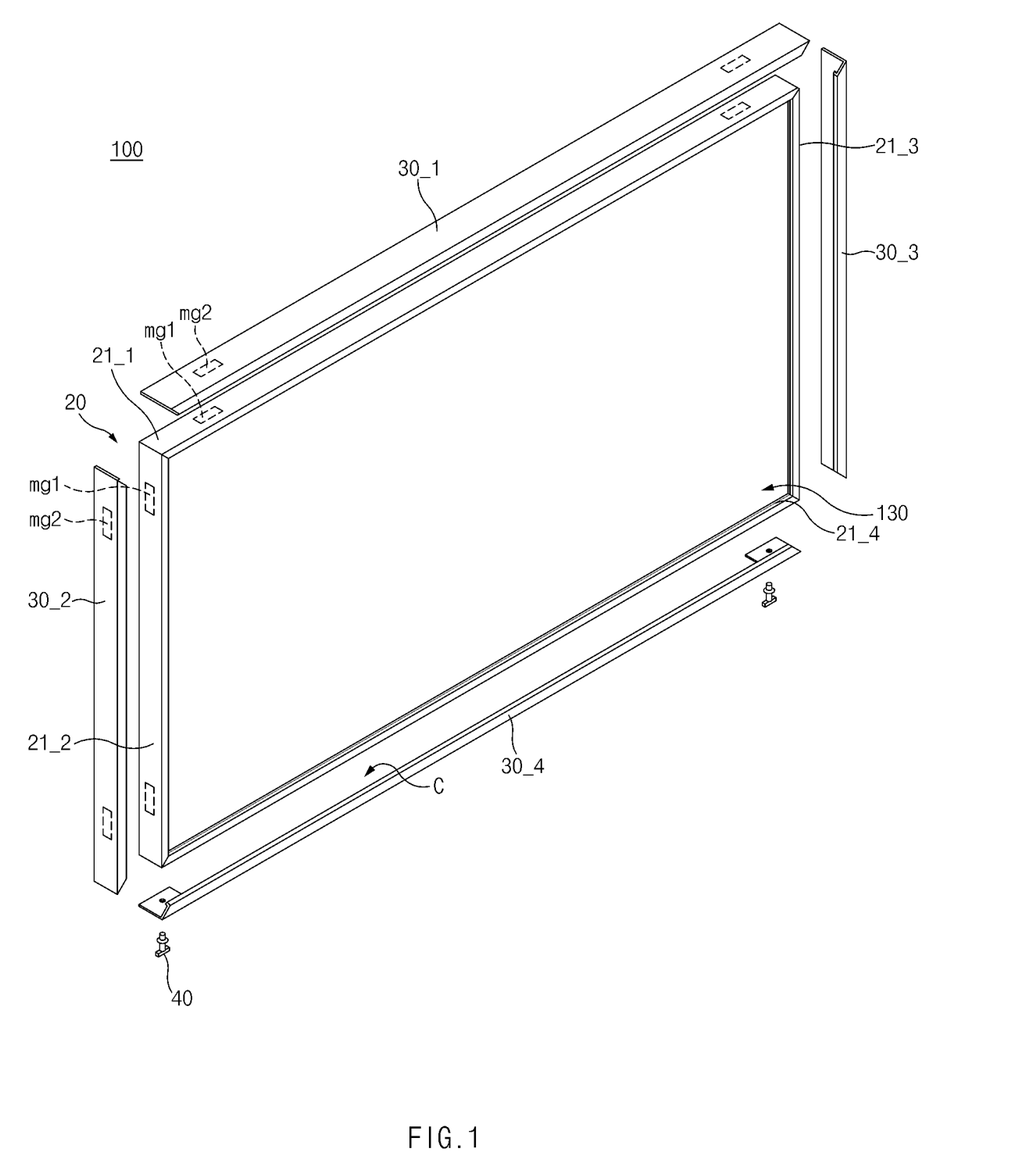
FIG. 1 is a perspective view of a display device according to an embodiment of the disclosure.

FIG. 1 is a perspective view of a display device according to various embodiments of the disclosure.

Referring to FIG. 1, a display device 100 according to various embodiments may include a bezel 21_1 to 21_4 and a frame 30_1 to 30_4.

According to an embodiment, the bezel 21_1 to 21_4 may form a boundary region of a body part 20. For example, in the case where the body part 20 is implemented by a combination of a front housing, a rear housing, and the bezel 21_1 to 21_4, the bezel 21_1 to 21_4 may be coupled to the boundary of the front housing and the boundary of the rear housing to form side surfaces of the body part 20. In another example, the body part 20 may be implemented by a combination of the front housing, the rear housing, and a side housing. In this case, the bezel 21_1 to 21_4 may be superimposed on the side housing of the body part 20 to form the side surfaces of the body part 20.

According to an embodiment, each of the bezel parts 21_1 to 21_4 may have or include at least one first member mg1 therein. For example, in the case where the body part 20 of the display device 100 includes a total of four side surfaces, the bezel 21_1 to 21_4 may include at least four first members mg1 to correspond to the respective side surfaces of the body part 20. For convenience of drawing, FIG. 1 illustrates one example that the first members mg1 are included in only the two bezel parts 21_1 and 21_2. However, the disclosure may not be limited thereto.

In an embodiment, the first members mg1 may be formed to correspond to the lengths of side surfaces (e.g., 21_1) of the bezel parts 21_1 to 21_4. For example, the bezel parts 21_1 to 21_4 may include more first members mg1 with an increase in length thereof. In another example, the bezel parts 21_1 to 21_4 may include longer first members mg1 with an increase in length thereof. The first members mg1 may be magnetic materials, for example, permanent magnets or electromagnets. In another example, the first members mg1 may be first metals (e.g., iron) on which attractive forces of magnet materials are exerted. FIG. 1 illustrates one example that the side surfaces (e.g., 21_1) of the bezel parts 21 each include two first members mg1.

In an embodiment, the body part 20 may be a housing that contains or includes a display and a circuit component of the display device 100. The circuit component may be, for example, a component of the display device 100 described with reference to FIG. 1. The body part 20 may include a plurality of housings. For example, the body part 20 may be implemented by a combination of the front housing that forms an active area of the display, the rear housing that faces the front housing, and the bezel 21_1 to 21_4. At least part of the front housing may be formed of a transparent material. For example, the region of the front housing that overlaps at least the active area of the display 130 may be formed of a transparent material so as not to hide the active area.

According to an embodiment, the frame 30_1 to 30_4 may include second members mg2 on which the first members mg1 exert attractive forces. The frame 30_1 to 30_4 may be fixed to the bezel 21_1 to 21_4 by the attractive forces between the first members (e.g., mg1) and the second members (e.g., mg2). One of the first and second members mg1 and mg2 may include a magnetic material, and the other may be a magnetic material or the first metal. In an embodiment, the second members mg2 may be provided, for example, in regions on which the first members mg1 exert attractive forces, among the entire region of the frame 30_1 to 30_4 and may fix the frame 30_1 to 30_4 to the bezel 21_1 to 21_4 by using the attractive forces between the first and second members (e.g., mg1 and mg2) when the frame 30_1 to 30_4 is contiguous with the bezel 21_1 to 21_4.

According to an embodiment, the frame 30_1 to 30_4 may include a plurality of frame pieces 30_1 to 30_4 that are fixed to the side surfaces (e.g., 21_1) of the bezel parts 21_1 to 21_4, respectively. In this case, each frame piece (e.g., 30_1) may include at least one second member mg2. FIG. 1 illustrates one example that each of the first to third frame pieces 30_1 to 30_3 includes two second members mg2 and the fourth frame piece 30_4 includes screw members 40.

A varying number of frame pieces (e.g., 30_1) may be provided, but in the following description, it will be exemplified that the frame 30_1 to 30_4 includes the first to fourth frame pieces 30_1 to 30_4 that are fixed to the four side surfaces (e.g., the upper, left, right, and lower side surfaces) of the body part 20, respectively.

According to an embodiment, the frame piece (e.g., 30_1) may be formed of at least one material among the first metal, aluminum, and sliced veneer. The frame piece (e.g., 30_1) may be formed of different materials for respective portions thereof. For example, a first surface (hereinafter, refer to 30_s of FIGS. 2 and 3) of the frame piece may be formed of the first metal, and other surfaces thereof may be formed of an aluminum material. In another example, the frame piece (e.g., 30_1) may be formed of an aluminum material, and the first surface 30_s of the frame piece may be implemented with a surface of a hollow type in which the second members mg2 are embedded. A structure in which the second members mg2 are embedded in the frame piece (e.g., 30_1) will be described below with reference to FIGS. 6A to 6D.

According to an embodiment, the frame pieces 30_1 to 30_4 may be fixed to the bezel parts 21_1 to 21_4, respectively, by using at least one of a coupling structure in the shape of "⊂" or a stopping structure of a corner, in addition to the attractive forces between the first and second members mg1 and mg2. The coupling structure in the shape of "⊂" will be described with reference to FIGS. 2 and 3. The stopping structure of the corner will be described with reference to FIG. 4. In an embodiment, at least one frame piece (e.g., 30_4) among the frame pieces 30_1 to 30_4 may be fixed to the bezel part (e.g., 21_4) by the screw members 40. The fixing structure of the frame piece (e.g., 30_4) by the screw members 40 will be described with reference to FIGS. 5A to 5D. In an embodiment, the frame 30_1 to 30_4 is fixed to the bezel 21_1 to 21_4 by a fixing member not requiring a tool such as a screwdriver, for example, at least one of the first and second members, the coupling structure in the shape of "⊂" or the stopping structure of the corner, which enables the user to easily replace the frame without needing to use a tool.

According to an embodiment, the frame pieces 30_1 to 30_4 may have various colors and designs. The frame pieces 30_1 to 30_4 may have various sizes and shapes to hide the bezel parts 21_1 to 21_4. The frame pieces 30_1 to 30_4 may be made attractive in various ways. For example, the frame pieces 30_1 to 30_4, after formed in predetermined sizes and shapes, may be made attractive by applying a spray of coating liquid (e.g., paint), attachment of a sheet, etching of a pattern for design to the outer surfaces. As described above, in the embodiment, the removable frame is applied to the display device, which enables the user to easily change a frame color or a pattern according to surroundings.

According to an embodiment, surfaces of the frame pieces 30_1 to 30_4 that are coupled to the display device 100 have almost the same structure and size, but surfaces that form the appearance of the display device 100 may have various sizes and shapes. For example, the frame pieces 30_1 to 30_4 may be made thicker and may have bumpy structures formed on the outer surfaces thereof. As described above, in the embodiment, various effects may be provided to the appearance (or the periphery) of the display device 100 by using the frame 30_1 to 30_4. In the embodiment, the frame may be implemented in various sizes, shapes, and designs to variously decorate the appearance of the display device 100.

In an embodiment, in the case where the bezel exposes the black mount (BM) area of the display device (or the peripheral portion of the active area of the display) due to a deviation in the manufacturing process of the display device, the BM area of the display device may be hidden by the frame. Due to this, in the embodiment, the frame may make the display device look more like a picture frame when the display device performs a picture frame function, thereby improving an environment beautification effect due to the display device.

Figure 2:
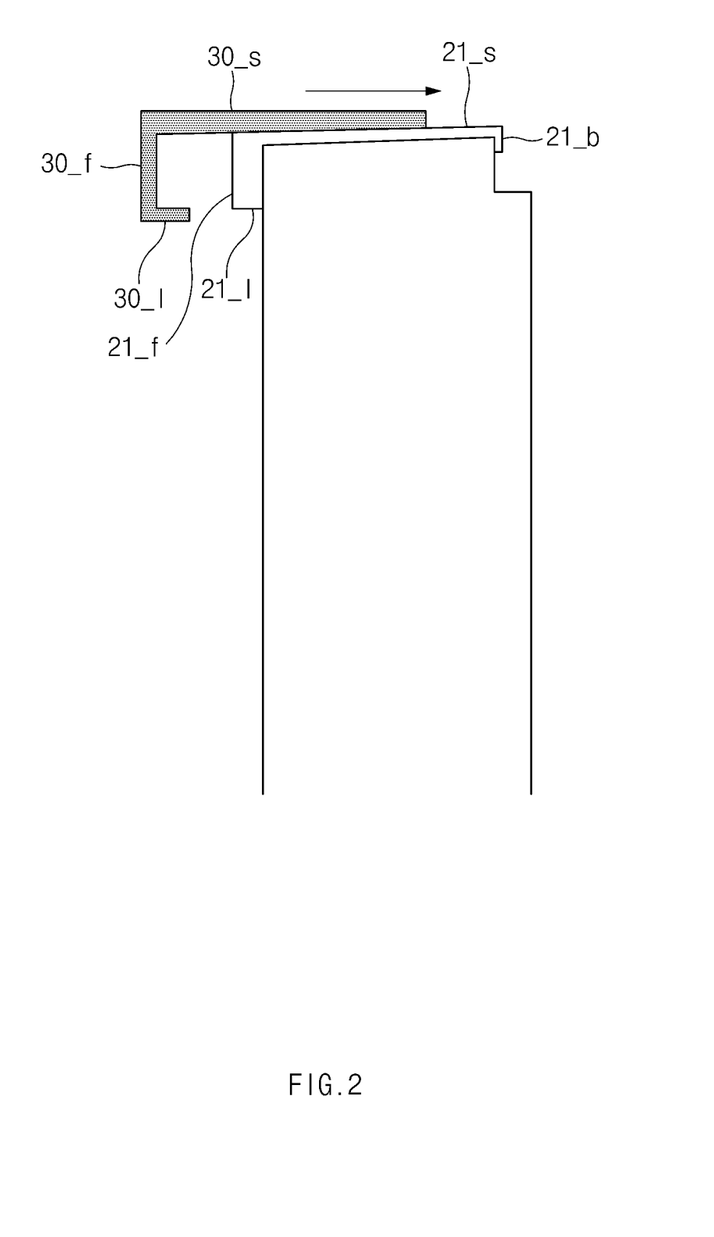
FIG. 2 is an upper side view of the display device to which a three-sided frame piece according to an embodiment of the disclosure is applied.
Figure 3:
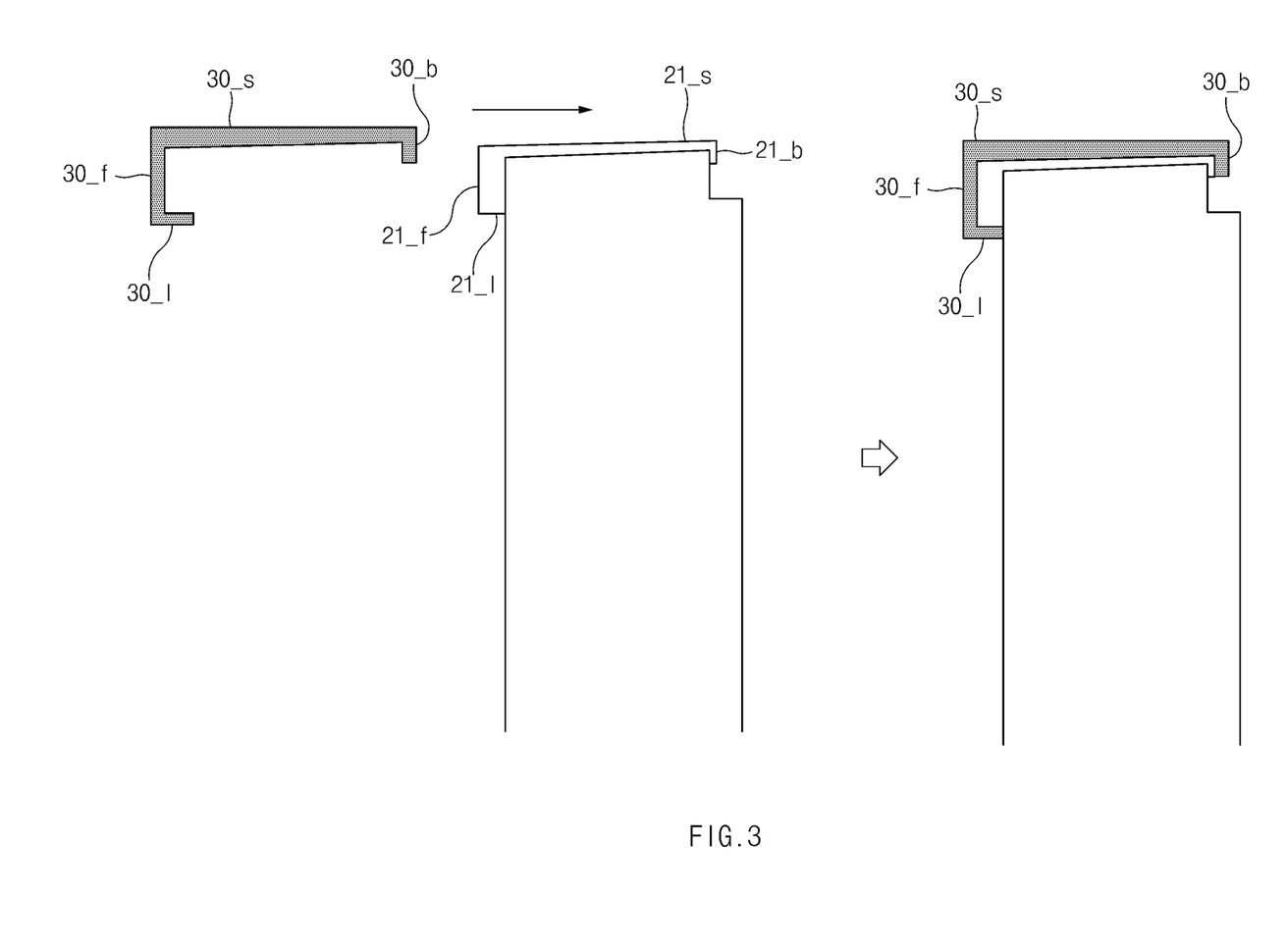
FIG. 3 is an upper side view of the display device to which a four-sided frame piece according to an embodiment of the disclosure is applied.

FIG. 2 is an upper side view of the display device to which a three-sided frame piece according to an embodiment of the disclosure is applied. FIG. 3 is an upper side view of the display device to which a four-sided frame piece according to an embodiment of the disclosure is applied. A coupling structure in the shape of "⊂" for a frame piece will be described with reference to FIGS. 2 and 3.

Referring to FIGS. 2 and 3, the bezel parts (e.g., 21_1 to 21_4) may form four sides of the body part 20, respectively. Each bezel part (e.g., 21_1) may include first to fourth surfaces 21_s, 21_f, 21_l, and 21_b. The first surfaces 21_s of the bezel parts 21_1 to 21_4 may be formed on the side surfaces of the body part 20. The second surfaces 21_f of the bezel parts may be surfaces formed in a display direction of the display 130. The display direction of the display may be a direction toward the front surface of the display device 100. The third surfaces 21_l of the bezel parts 21_1 to 21_4 may be surfaces that are contiguous to the second surfaces 21_f of the bezel parts and are formed in a direction toward the center of the display 130. The fourth surfaces 21_b of the bezel parts 21_1 to 21_4 may be surfaces that are formed to be contiguous to the rear boundary of the body part 20.

Referring to FIG. 2, according to an embodiment, each frame piece (e.g., 30_1) may include first to third surfaces 30_s, 30_f, and 30_l. The first to third surfaces 30_s, 30_f, and 30_l may be contiguous to each other to form the shape of "⊂" (region A). When the frame piece (e.g., 30_1) is fixed to the bezel part (e.g., 21_1), the surfaces 30_s, 30_f, and 30_l of the frame piece (e.g., 30_1) may cover the respective surfaces 21_s, 21_f, and 21_l of the bezel part (e.g., 21_1). For example, the first surface 30_s of the frame piece may cover the first surface 21_s of the bezel part, the second surface 30_f of the frame piece may cover the second surface 21_f of the bezel part, and the third surface 30_l of the frame piece may cover the third surface 21_l of the bezel part. Due to the structure in the shape of "⊂", each frame piece (e.g., 30_1) may be coupled with the bezel part (e.g., 21_1) in a direction (refer to the arrow of FIG. 2) that is opposite to the display direction of the display device 100.

Referring to FIG. 3, the frame piece (e.g., 30_1) may further include a fourth surface 30_b. In this case, the fourth surface 30_b of the frame piece (e.g., 30_1) may be formed so as not to disturb a process in which the frame piece (e.g., 30_1) is coupled to the bezel part (e.g., 21_1) in the direction of the arrow of FIG. 3. For example, the frame piece (e.g., 30_1) may be formed of a flexible material. Accordingly, in the process of being coupled to the bezel part (e.g., 21_1), the fourth surface 31_b of the frame piece (e.g., 30_1) may rotate in the direction in which the internal angle between the first surface 30_s and the fourth surface 31_b increases, and may then return to the original state after the frame piece (e.g., 30_1) is coupled with the bezel part (e.g., 21_1).

Figure 4:
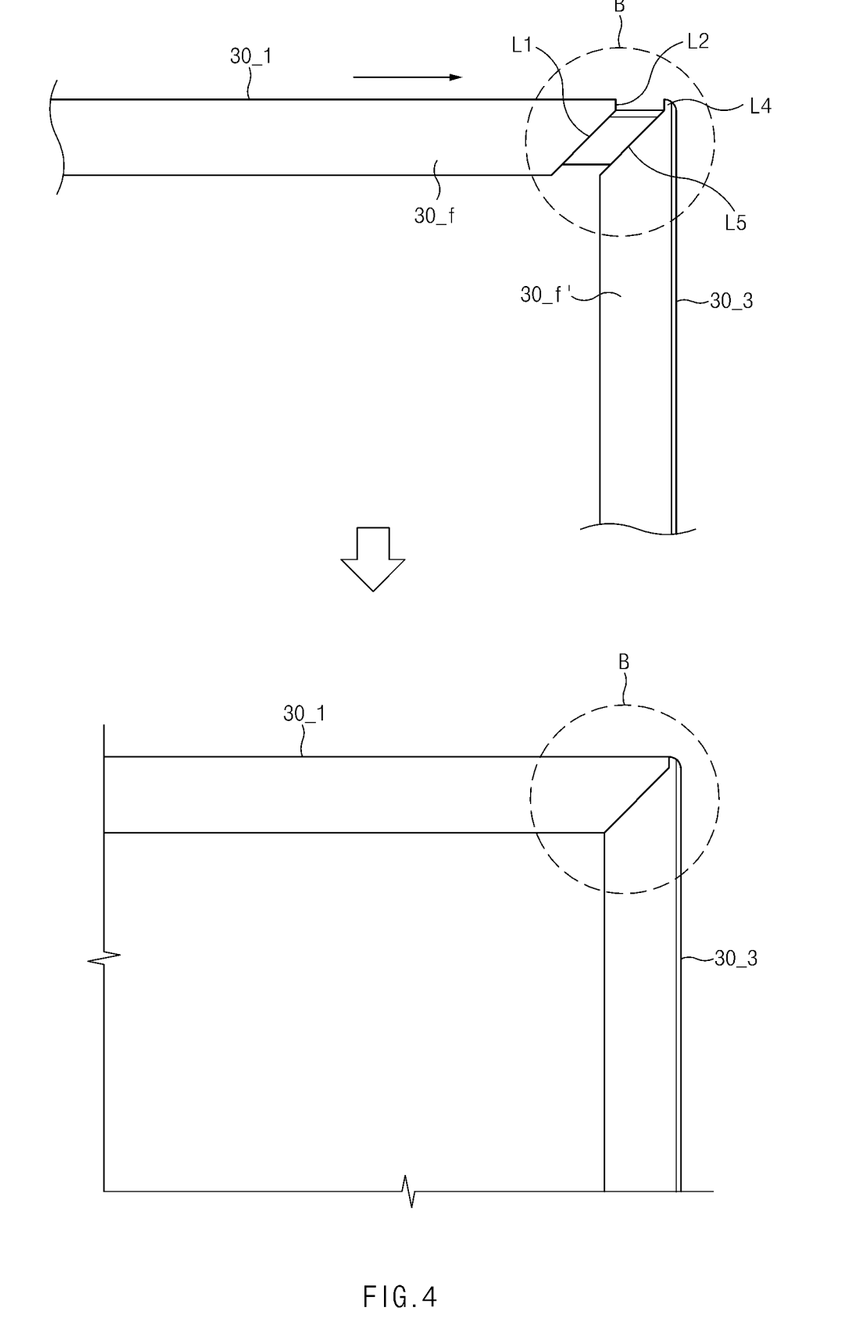
FIG. 4 illustrates front views of one corner of the display device before and after engagement of frame pieces according to an embodiment of the disclosure.

FIG. 4 illustrates front views of one corner of the display device before and after engagement of frame pieces according to an embodiment of the disclosure. A stopping structure of corner regions of the frame pieces will be described with reference to FIG. 4.

Referring to FIG. 4, according to an embodiment, each frame piece (e.g., 30_1) may include a stopping structure of a corner region (refer to B of FIG. 4). For example, each end of the surface of the frame piece (e.g., 30_1) that is formed in the display direction of the display 130 may include first and second straight lines that form an angle of less than 90 degrees therebetween, or may include a third straight line and a third straight line that form an angle of more than 90 degrees therebetween. In another example, a first end (refer to B) of the first surface 30_f of one frame piece (e.g., 30_1) may include a plurality of straight lines L1 and L2. The angle between the first straight line L1 and the second straight line L2 may exceed 90 degrees. A second end of the first surface 30_f of the one frame piece (e.g., 30_1) or a first end (refer to B) of a first surface 30_f of another frame piece (e.g., 30_3) that is contiguous with the first end of the first surface 30_f of the one frame piece may include a plurality of straight lines L3 and L4. The angle between the third straight line L3 and the fourth straight line L4 may exceed 180 degrees. The frame piece (e.g., 30_1) may be fixed to the other frame piece (e.g., 30_3) by a stopping structure of a corner region so as to be contiguous with the other frame piece (e.g., 30_3). Alternatively, a side of the surface of the frame piece (e.g., 30_1) that is parallel to the display direction of the display device 100 may include a stopping structure of a corner region (refer to B of FIG. 4) that is constituted by the plurality of straight lines L1 and L2. The frame piece (e.g., 30_1) may be fixed to the other frame piece (e.g., 30_3) by the stopping structure of the corner region so as to be contiguous with the other frame piece (e.g., 30_3).

The case in which the first frame piece 30_1 is mounted on the display device 100 with the third frame piece 30_3 mounted on the right side of the display device 100 will be described with reference to FIG. 4. In this case, the first frame piece 30_1 may be mounted on the display device 100 by using the structure in the shape of "⊂" in the opposite direction to the display direction of the display device 100 from a position slightly to the left of the location where the first frame piece 30_1 is to be fixed to the bezel part 21_2. Thereafter, the first frame piece 30_1 may move from left to right of the display device 100 (refer to the arrow of FIG. 4) and may be contiguous with the third frame piece 30_3. The first frame piece 30_1 may not deviate to the right of the display device 100 due to the coupling structure B of the corner region. Furthermore, the third frame piece 30_3 may not deviate above the display device 100 due to the structure B engaged with the corner of the second frame piece 21_2.

The first frame piece 30_1 and the third frame piece 30_3 are illustrated in FIG. 4. However, likewise to the first frame piece 30_1, the fourth frame piece 30_4 may also not move above and below the display device 100 due to a coupling structure in the shape of "⊂". Furthermore, the first and fourth frame pieces 30_1 and 30_4 may not move to the left or right of the display device 100 due to stopping structures of corner regions contiguous with the second and third frame pieces 30_2 and 30_3 that are contiguous to the first and fourth frame pieces 30_1 and 30_4. In addition, likewise to the third frame piece 30_3, the second frame piece 30_2 may also not move to the left and right of the display device 100 due to the coupling structures in the shape of "⊂". Furthermore, the second and third frame pieces 30_2 and 30_3 may not move above or below the display device 100 due to the corner stopping structures of the first and fourth frame pieces 30_1 and 30_4 that are contiguous to the second and third frame pieces 30_2 and 30_3.

In the above-described embodiment, the corner region of each frame piece (e.g., 30_1) may be formed so as not to be pointed, due to the stopping structure of the corner region. Accordingly, in the embodiment, a user may be prevented from being injured due to the corner region of the frame piece in the process of fixing the frame piece (e.g., 30_1) to the bezel part.

Figure 5A:
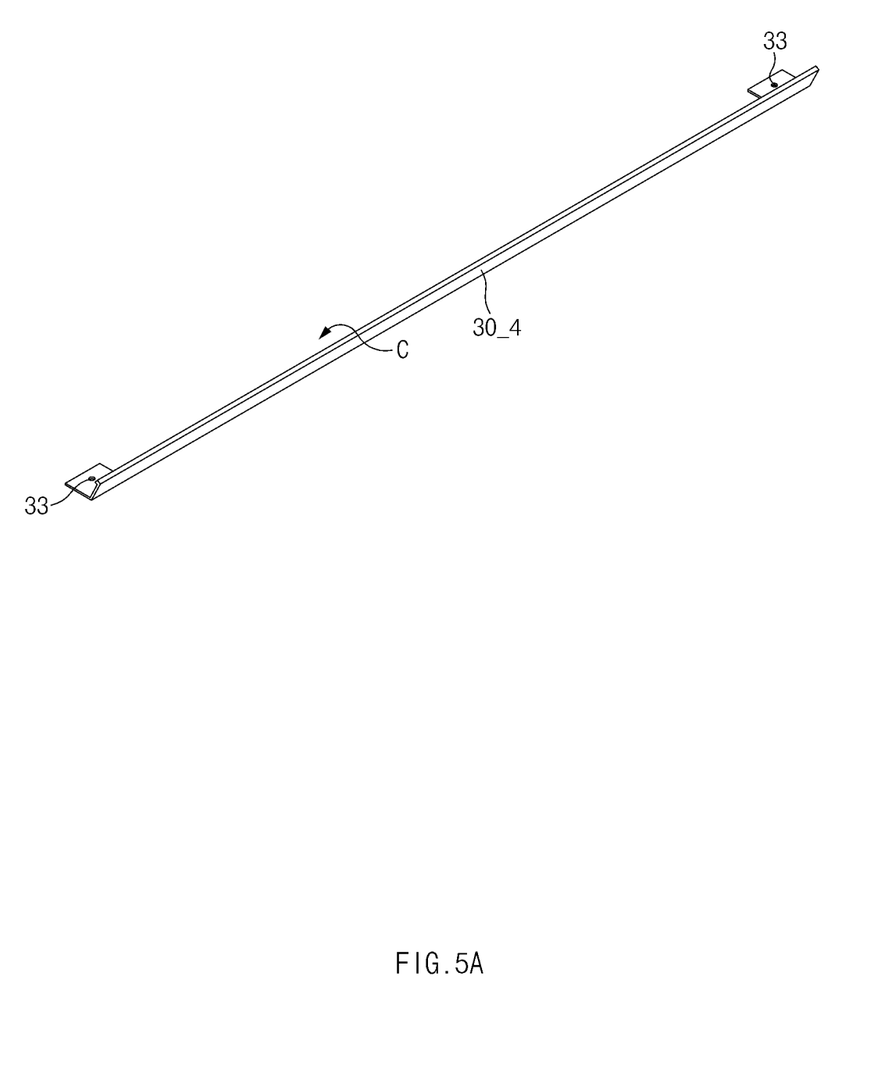
FIG. 5A is a perspective view illustrating a fourth frame piece according to an embodiment of the disclosure, when viewed in a first direction.
Figure 5B:
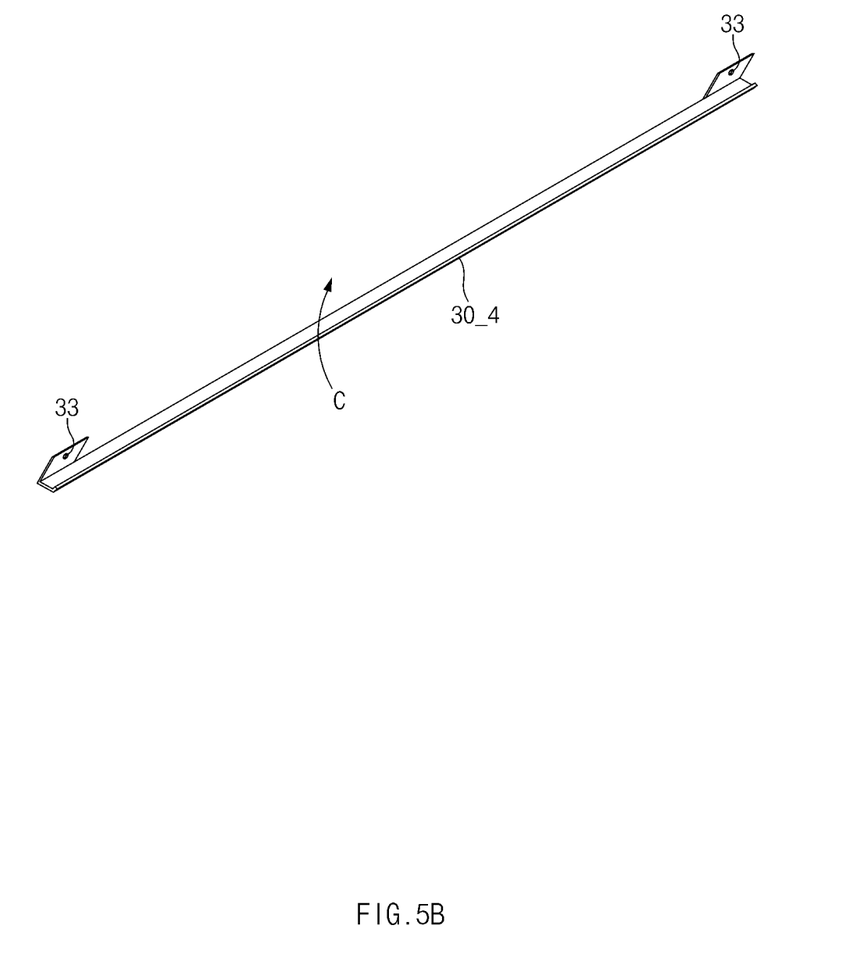
FIG. 5B is a perspective view illustrating the fourth frame piece according to the embodiment of the disclosure, when viewed in a second direction.
Figure 5C:
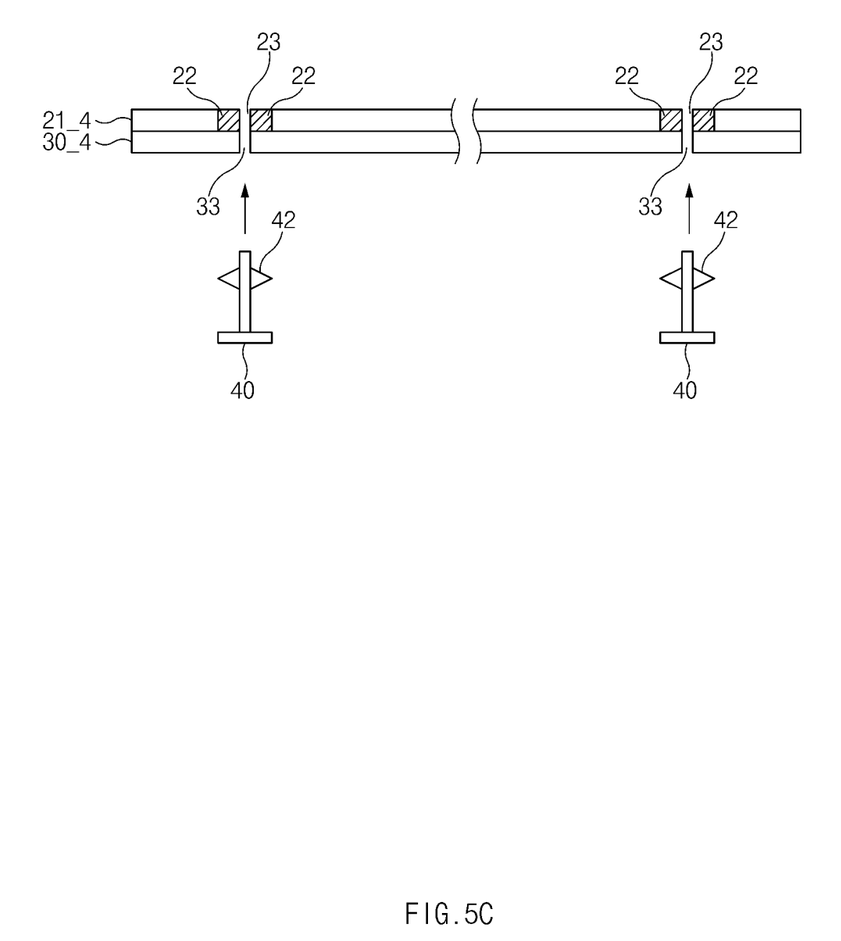
FIG. 5C is a sectional view of the fourth frame piece before screw members are coupled according to an embodiment of the disclosure.
Figure 5D:
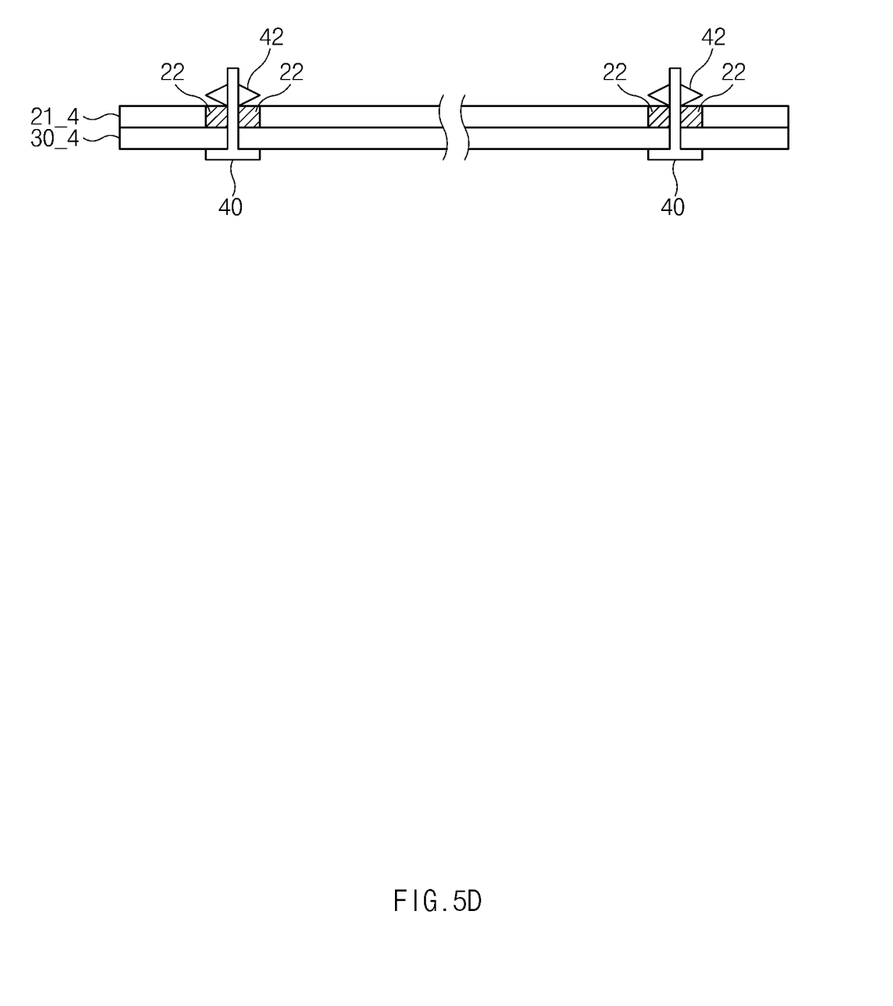
FIG. 5D is a sectional view of the fourth frame piece to which the screw members are coupled according to an embodiment of the disclosure.

FIG. 5A is a perspective view illustrating the fourth frame piece according to an embodiment of the disclosure, when viewed in a first direction. FIG. 5B is a perspective view illustrating the fourth frame piece according to the embodiment of the disclosure, when viewed in a second direction. FIG. 5C is a sectional view of the fourth frame piece before screw members are coupled according to an embodiment of the disclosure. FIG. 5D is a sectional view of the fourth frame piece to which the screw members are coupled according to an embodiment of the disclosure. Descriptions of FIGS. 5A to 5D will be focused on a coupling structure using the screw members.

Referring to FIGS. 5A and 5B, according to an embodiment, at least one of the plurality of frame pieces 30_1 to 30_4, for example, the fourth frame piece 30_4 may include an opening region C in the first surface thereof, and at least a partial area of the first surface (e.g., 21_s) of the corresponding bezel part may be exposed through the opening region C. A first component of the display device 100, such as a speaker or a power cable, which needs to be exposed to the outside or requires an external interface may be provided on the first surfaces (e.g., 21_s) of the bezel parts 21_1 to 21_4. Accordingly, in the embodiment, the fourth frame piece 30_4 may allow the first component to be easily exposed through the opening region C.

Referring to FIGS. 5A to 5D, according to an embodiment, at least one of the plurality of frame pieces 30_1 to 30_4, for example, the fourth frame piece 30_4 may be coupled with the lower bezel part 21_4 of the display device 100 by using the screw members 40. The lower bezel part 21_4 and the fourth frame piece 30_4 may have a plurality of first holes 23 and a plurality of second holes 33, respectively, to which the screw members 40 are coupled. Accordingly, the screw members 40 may be inserted in a direction from the outside of the fourth frame piece 30_4 to the inside of the lower bezel part 21_4 and may be fixed inside the lower bezel part 21_4 after passing through the first holes 23 and the second holes 33.

In an embodiment, at least one of the screw members 40 and the lower bezel part 21_4 may include a structure for fixing the screw members 40, which are coupled with the frame piece (e.g., 30_4) and the lower bezel part 21_4, inside the lower bezel part 21_4. Referring to FIG. 5D, when the screw members 40 pass through the first holes 23 and the second holes 33, heads of the screw members 40 may be stopped by the outside of the fourth frame piece 30_4, and protrusions (e.g., 42) of the screw members may be stopped by the inside of the lower bezel part 21_4. Accordingly, the heads and the protrusions (e.g., 42) may prevent the screw members 40 from being separated from the first and second holes 23 and 33.

For example, each of the screw members 40 includes a head and body, and a protrusion (e.g., 42) may be formed close to the distal end of the body. The protrusion (e.g., 42) may be formed close to the distal end of the screw member 40 that is located on the opposite side to the head of the screw member 40, and may have a shape that is formed around the body of the screw member 40 and protrudes outward. For example, the protrusion (e.g., 42) may have a shape that protrudes along the circumference of the body of the screw member 40. In another example, the protrusion (e.g., 42) may include two protrusions that are formed in perpendicular directions to the side of the body of the screw member 40 so as to be symmetric to each other. The gap between the head of the screw member 40 and the protrusion (e.g., 42) of the screw member 40 may correspond to the sum of the depths of the first hole 23 and the second hole 33.

In an embodiment, contact surfaces of the first and second holes 23 and 33 and the screw member 40 may include a structure that enables the screw member 40 to easily pass through the first and second holes 23 and 33 and prevents the screw member 40 from being easily separated from the first and second holes 23 and 33. For example, the diameter of at least one of the first and second holes 23 and 33 may be larger than the width of the body of the screw member 40 and may be smaller than the width of the protrusion (e.g., 42). Accordingly, in the embodiment, the screw member 40, after passing through the first and second holes 23 and 33, may not be easily separated from the first and second holes 23 and 33 due to the protrusion (e.g., 42). In another example, the contact surface of the screw member 40 in the lower bezel part 21_4 and the contact surface of the screw member 40 in the fourth frame piece 30_4 may be formed of a flexible material (e.g., an elastic material). Referring to FIGS. 5C and 5D, according to an embodiment, the fourth frame piece 30_4 may be formed entirely of a flexible material. As the fourth frame piece 30_4 is formed of a flexible material, the screw member 40 may pass through the second hole 33 even through the surface of the screw member 40 on which the protrusion (e.g., 42) is formed is larger than the width of the second hole 33. In an embodiment, an elastic member 22 may be provided on the contact surface of the screw member 40 in the lower bezel part 21_4. While the protrusion (e.g., 42) passes through the elastic member 22, the elastic member 22 may be pressed outside the second hole 33 by the protrusion (e.g., 42), and thus the width of the first hole 23 may be increased. Before or after the protrusion (e.g., 42) of the screw member passes through the elastic member 22, the elastic member 22 may return to the original position by the elasticity thereof, and thus the width of the first hole 23 may be reduced. To this end, the elastic member 22 may be formed to move in a direction to increase the width of the first hole 23 when pressed by a force from the outside of the lower bezel part 21_4 to the inside thereof or outside the first hole 23. Accordingly, the bezel part and the frame piece according to the embodiment may allow the protrusion (e.g., 42) to pass through the first and second holes 23 and 33 even though the surface of the screw member 40 on which the protrusion (e.g., 42) is formed is larger than the widths of the first and second holes 23 and 33, and may prevent the screw member 40 from being easily separated from the first and second holes 23 and 33 after passing through the first and second holes 23 and 33. Although the screw member 40 is applied to the lower bezel part 21_4 in the above-described embodiment, the screw member 40 may also be used for the left bezel part 21_2, the right bezel part 21_3, and the upper bezel part 21_1.

In the above-described embodiment, the fourth frame piece 30_4 is fixed to the bezel part 21_4 by using the screw member 40. However, the fourth frame piece 30_4 may include the second member (e.g., mg2) on which the first member (e.g., mg1) exerts an attractive force.

Figure 6A:
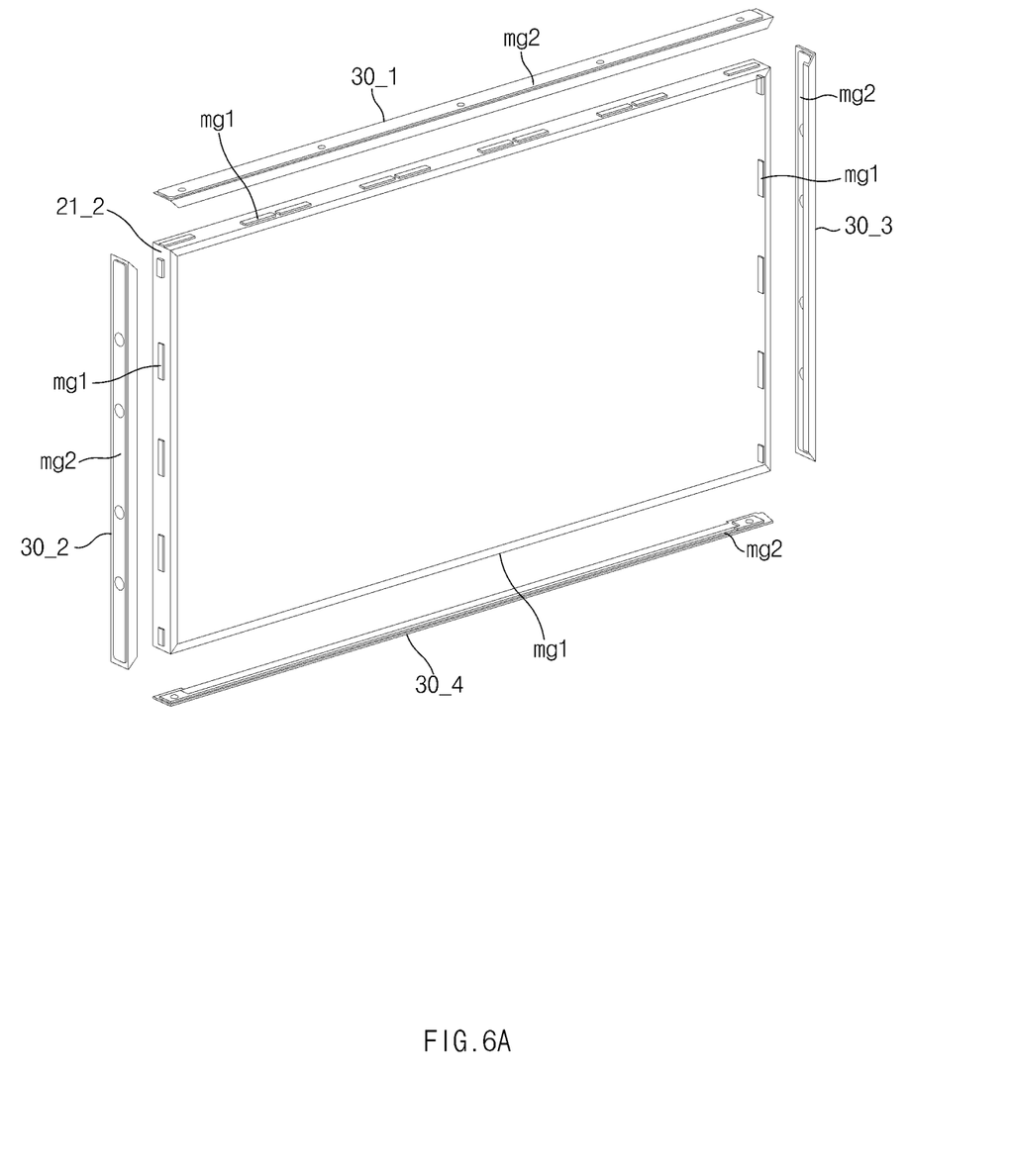
FIG. 6A is an exploded perspective view of a display device including first and second members according to an embodiment of the disclosure.
Figure 6B:
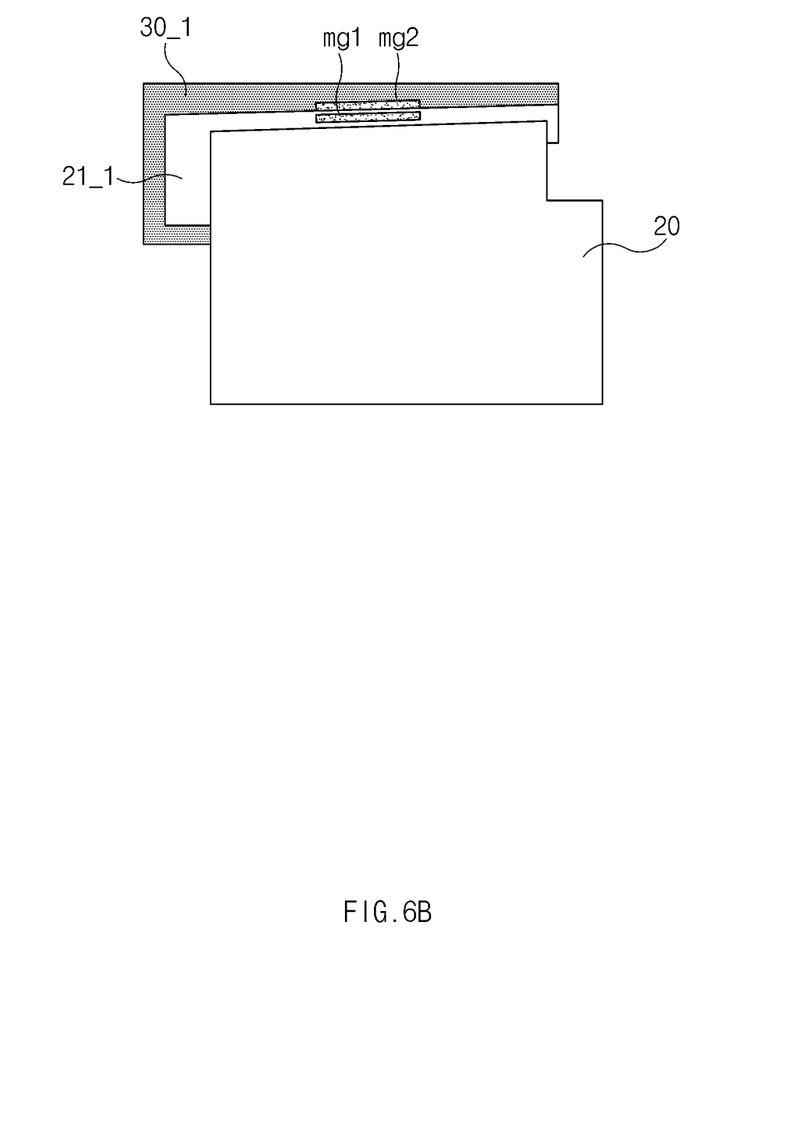
FIG. 6B is a side sectional view of the display device including the first and second members according to an embodiment of the disclosure.

FIG. 6A is an exploded perspective view of a display device including first and second members according to an embodiment of the disclosure. FIG. 6B is a side sectional view of the display device including the first and second members according to an embodiment of the disclosure.

Figure 6C:
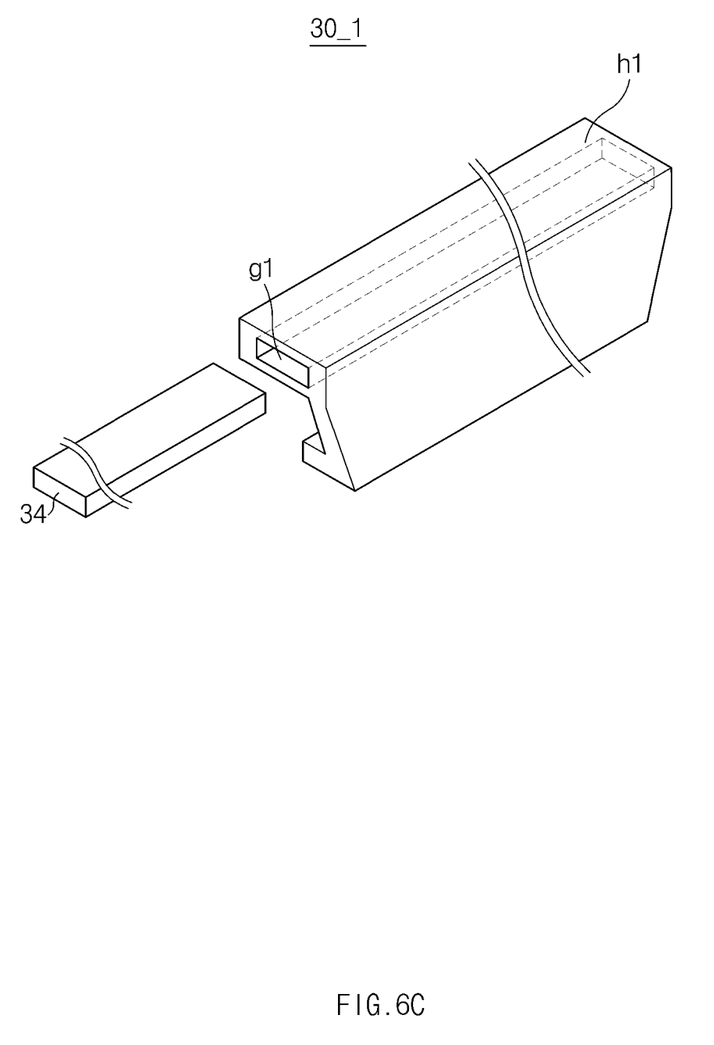
FIGS. 6C and 6D are exploded views of a frame piece according to an embodiment of the disclosure.
Figure 6D:
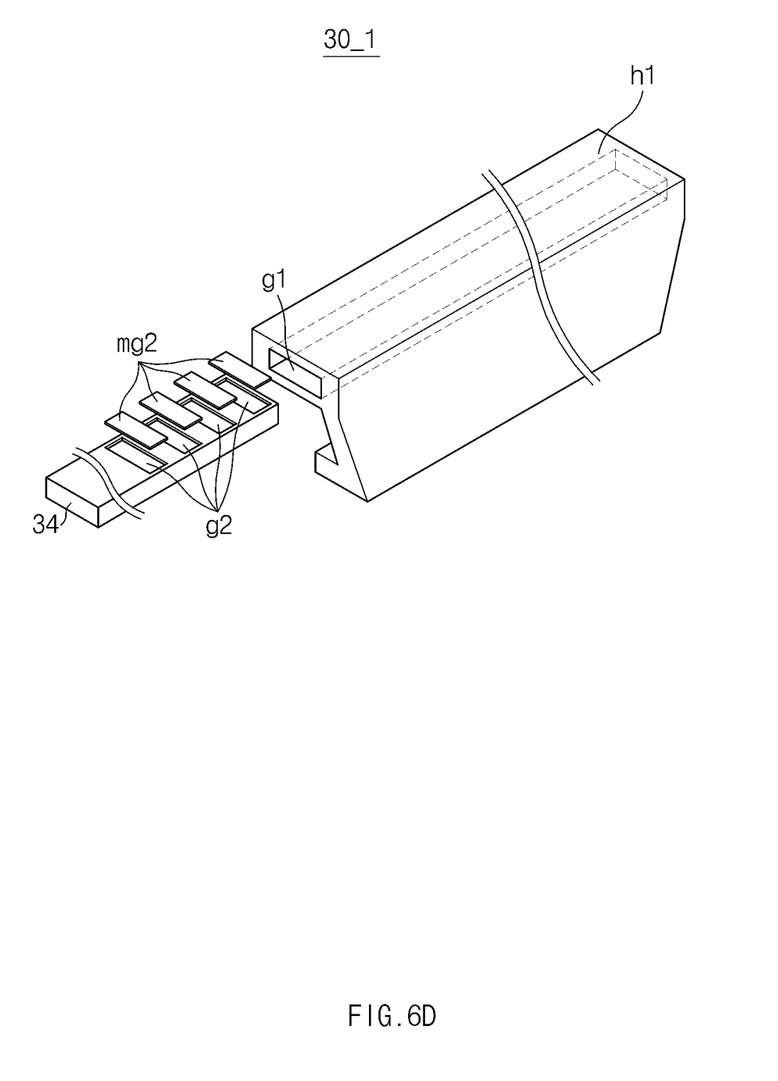

FIGS. 6C and 6D are exploded views of a frame piece according to an embodiment of the disclosure. A structure in which the first and second members are embedded according to an embodiment of the disclosure will be described with reference to FIGS. 6A to 6D.

According to an embodiment, the frame piece (e.g., 30_1) may include a housing hl coupled with each of bezel parts 21_1 to 21_4 on side surfaces of the display device and second members mg2 that are embedded in a hollow region g1 of the housing hl and on which first members mg1 exert attractive forces.

Referring to FIG. 6A, according to an embodiment, the first members mg1 of the bezel parts 21_1 to 21_4 may be magnetic materials, and the second members mg2 of the frame piece (e.g., 30_1) may be first metals. First surfaces (e.g., 31_s) of the bezel parts 21_1 to 21_4 may each include the plurality of magnetic materials mg1, and the locations where first to fourth frame pieces 30_1 to 30_4 are contiguous with or face at least the plurality of magnetic materials mg1 may be formed of the first metal. For example, first surfaces 30_s of the frame pieces (e.g., 30_1) may be formed of the first metal, and other surfaces 30_l, 30_f, and 30_b thereof may be formed of the first metal or a different material (e.g., aluminum). Accordingly, the first to fourth frame pieces 30_1 to 30_4 according to the embodiment may be fixed to the bezel parts 21_1 to 21_4 by the attractive forces that the plurality of magnetic materials mg1 exert on the first metals of the first surfaces (e.g., 31_s) of the first to fourth frame pieces 30_1 to 30_4. Alternatively, the first to fourth frame pieces 30_1 to 30_4 may each include a plurality of magnetic materials, and the bezel parts 21_1 to 21_4 may be formed of the first metal.

Referring to FIG. 6B, according to an embodiment, both the first members mg1 and the second members mg2 may be magnetic materials. The first and second members mg1 and mg2 may be provided on the bezel 21_1 to 21_4 and the frame 30_1 to 30_4 to exert attractive forces on each other. For example, the first and second members mg1 and mg2 may be provided on the inside of the bezel 21_1 to 21_4 and the inside of the frame 30_1 to 30_4 so as to be contiguous with each other and may exert attractive forces on each other. Accordingly, the first to fourth frame pieces 30_1 to 30_4 may be fixed to the bezel parts 21_1 to 21_4 by the attractive forces between the two magnetic materials mg1 and mg2 according to the embodiment.

Referring to FIGS. 6C and 6D, according to an embodiment, the frame piece (e.g., 30_1) may include the hollow region g1 therein and may have the second members mg2 in the hollow region g1. The hollow region g1 may be, for example, a hole formed in the frame piece (e.g., 30_1) by an extruding process. The hollow region g1 may be formed inside the frame piece (e.g., 30_1) along the length of the frame piece (e.g., 30_1).

In an embodiment, a second member mg2 may be provided in the frame piece (e.g., 30_1) to exert an attractive force on the first members mg1 provided on a side surface of each of the bezel parts 21_1 to 21_4. For example, referring to FIG. 6C, the second member mg2 and the hollow region g1 may be formed in such a size that the second member mg2 and the hollow region g1 are contiguous with all the first members mg1 on the side surface of each of the bezel parts 21_1 to 21_4. The second member mg2 may have a bar shape corresponding to the hollow region g1 and may be inserted into the hollow region g1 to fill the hollow region g1.

In another embodiment, the number of second members mg2 may correspond to the number of first members mg1 on the side surface of each of the bezel parts 21_1 to 21_4 on which the frame piece (e.g., 30_1) is mounted. The second members mg2 may be located in the frame piece (e.g., 30_1) so as to exert attractive forces on the first members mg1. Referring to FIG. 6D, the second members mg2 may be coupled (or fixed) to a bar member 34 and may be coupled to the hollow region g1 of the frame piece (e.g., 30_1) through the bar member 34. For example, the bar member 34 may have a shape corresponding to the hollow region. The bar member 34 may include at least one groove g2 in a plurality of positions spaced apart from each other by a specified interval, and a magnetic material or the first metal may be fixed to the groove g2. The plurality of positions may correspond to the positions of the first members mg1. In this case, the bar member 34 may be formed of a material other than the first metal and the magnetic material. As described above, in the second embodiment, the plurality of first and second members mg1 and mg2 are disposed on each of the bezel parts 21_1 to 21_4 and the frame piece (e.g., 30_1) so as to be spaced apart from each other by a predetermined interval, and therefore the frame piece (e.g., 30_1) may be located in the correct position by the attractive forces between the first and second members mg1 and mg2 even though the frame piece (e.g., 30_1) is mounted in a slightly misaligned position on each of the bezel parts 21_1 to 21_4.

Operations performed by a module, a program module, or other components according to various embodiments may be executed sequentially, in parallel, repeatedly, or in a heuristic method. In addition, some of the operations may be executed in different sequences or may be omitted. Alternatively, other operations may be added. The embodiments of the disclosure are provided merely to easily describe technical details of the disclosure and to help the understanding of the disclosure, and are not intended to limit the scope of the disclosure. Therefore, it should be construed that all modifications and changes or various other embodiments based on the scope and spirit of the disclosure fall within the scope of the disclosure.

The invention claimed is:

1. A display device comprising:
a bezel configured to form a border of a display, wherein the bezel includes at least one first member; and
a frame fixed to the bezel to hide a front surface of the bezel, wherein the frame includes a plurality of frame pieces, and
wherein each of the plurality of frame pieces includes at least one second member and is fixed to the bezel by an attractive force between the at least one first member and the at least second member,
wherein each of the plurality of frame pieces includes a hollow region in which the at least second member is embedded, and
wherein the at least second member is fixed to a bar member that has a shape and a size that correspond to the hollow region, and is embedded in the hollow region by inserting the bar member into the hollow region.

2. The display device of claim 1, wherein one of the at least one first member and the at least one second member is a magnetic material, and
wherein the another of the at least one first member and the at least one second member is a metal or a magnetic material on which the magnetic material exerts an attractive force.

3. The display device of claim 1, wherein the bezel includes a first surface, a second surface and a third surface, wherein the first surface of the bezel is formed on a side surface of the display device, wherein the second surface of the bezel is contiguous with the first surface and is formed in a display direction of the display, wherein the third surface of the bezel is contiguous with the first surface of the bezel and is formed in a direction toward a center of the display, wherein the plurality of frame pieces include a first surface, a second surface and a third surface, wherein the first surface of the frame piece is formed to cover the first surface of the bezel, wherein the second surface of the frame piece is formed to cover the second surface of the bezel, and wherein the third surface of the frame piece is formed to cover the third surface of the bezel.

4. The display device of claim 3, wherein the first surface, the second surface and the third surface of each of the plurality of frame pieces are formed in a shape of "⊂" to cover the first surface, the second surface and the third surface of the bezel and are mounted on the bezel from the display direction of the display to an opposite direction to the display direction.

5. The display device of claim 1, wherein each of opposite ends of a surface of each frame piece that is formed in a display direction of the display includes first and second straight lines that form an angle of less than 90 degrees therebetween, or includes third and fourth straight lines that form an angle of more than 90 degrees therebetween.

6. The display device of claim 1, wherein at least one frame piece, among the plurality of frame pieces, is coupled with the bezel by at least one screw member, wherein the at least one frame piece includes a first hole, wherein the bezel includes a second hole in a position corresponding to the first hole, and wherein the at least one frame piece and the bezel are coupled with each other by the at least one screw member passing through the first hole and the second hole.

7. The display device of claim 6, wherein contact surfaces of the first hole and the second hole and the at least one screw member are formed of an elastic or flexible material.

8. The display device of claim 1, wherein the at least one second member is formed in the shape and the size corresponding to the hollow region and is inserted into the hollow region.

9. A frame member coupled with a bezel, wherein the bezel includes at least one first member and forms a border of a display device, the frame member comprising:

a plurality of frame pieces fixed to the bezel to hide a front surface of the bezel, wherein each of the plurality of frame pieces includes:

a housing including a hollow region, and at least one second member embedded in the hollow region to exert an attractive force on the at least one first member, wherein the at least one second member is fixed to a bar member having a shape and a size that correspond to the hollow region, and is embedded in the hollow region by inserting the bar member into the hollow region.

10. The frame member of claim 9, wherein the bezel includes a first surface, a second surface and a third surface, wherein the first surface of the bezel is formed on a side surface of a body part, wherein the second surface of the bezel is contiguous with the first surface of the bezel and is formed in a display direction of the display device, wherein the third surface of the bezel is contiguous with the first surface of the bezel and is formed in a direction toward a center of the display device, wherein each of the plurality of frame pieces includes a first surface, a second surface and a third surface, wherein the first surface of the frame piece is formed to cover the first surface of the bezel, wherein the second surface of the frame piece is formed to cover the second surface of the bezel, and wherein the third surface of the frame piece is formed to cover the third surface of the bezel.

11. The frame member of claim 9, wherein the first surface, the second surface and the third surface of each frame piece are formed in a shape of "⊂" to cover the first surface, the second surface and the third surface of the bezel and are mounted on the bezel from a display direction of the display device to an opposite direction to the display direction.

12. The frame member of claim 9, wherein the second member is formed in the shape and the size corresponding to the hollow region and is inserted into and embedded in the hollow region.

13. The frame member of claim 9, wherein opposite ends of a surface of the housing that is formed in a display direction of the display device include a plurality of straight lines.

* * * * *